United States Patent [19]

Cooper et al.

[11] 4,192,011
[45] Mar. 4, 1980

[54] MAGNETIC DOMAIN PACKAGING

[75] Inventors: Paul V. Cooper, Northampton; Steven J. Adamson, Towcester, both of England

[73] Assignee: Plessey Handel und Investments AG, Zug, Switzerland

[21] Appl. No.: 900,143

[22] Filed: Apr. 26, 1978

[30] Foreign Application Priority Data

Apr. 28, 1977 [GB] United Kingdom ............... 17709/77

[51] Int. Cl.² ........................ G11C 5/04; G11C 19/08
[52] U.S. Cl. ...................................................... 365/2
[58] Field of Search ............................................ 365/2

[56] References Cited
U.S. PATENT DOCUMENTS
4,096,581  6/1978  Carlo ........................................ 365/2

Primary Examiner—James W. Moffitt
Attorney, Agent, or Firm—Fleit & Jacobson

[57] ABSTRACT

A magnetic bubble device is provided comprising a substrate, a device chip and interconnecting conductors for connecting the device chip to the substrate and for supporting the device chip on the substrate so that by providing a hole in the substrate and turning over the device chip, the active surface of the device chip is arranged substantially co-planar with the top surface of the substrate, thereby enabling a reduced height device to be obtained.

6 Claims, 6 Drawing Figures

U.S. Patent
Mar. 4, 1980
4,192,011
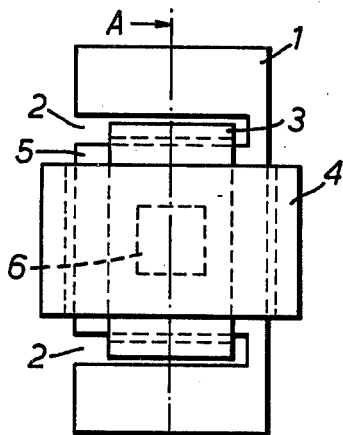
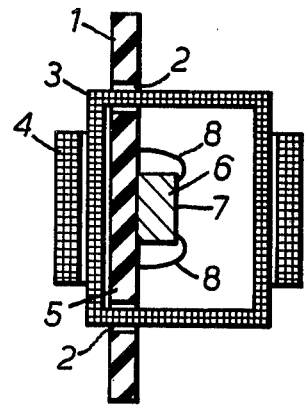
FIG. 1.
PRIOR ART
FIG. 2.
PRIOR ART
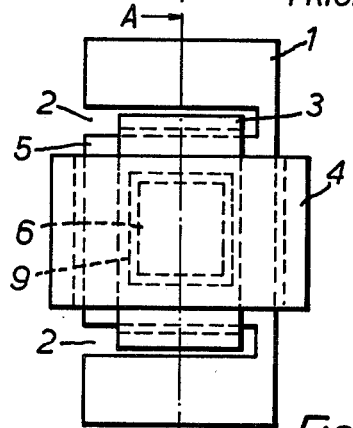
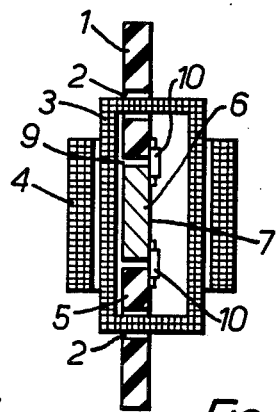
FIG. 3.
FIG. 4.
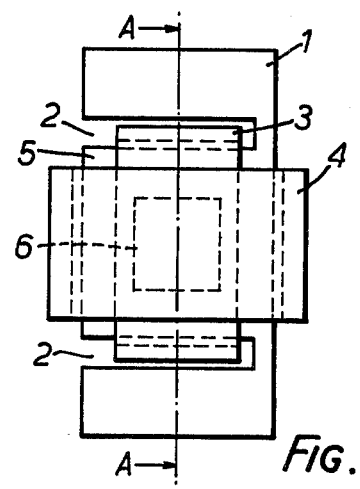
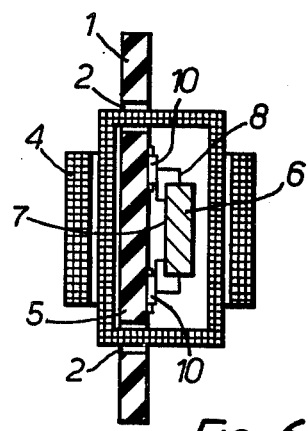
FIG. 5.
FIG. 6.

MAGNETIC DOMAIN PACKAGING

This invention relates to magnetic domain devices commonly referred to as magnetic bubble devices.

In one existing form of magnetic bubble device a so-called 'W' shaped substrate is provided, typically in the form of a printed circuit board, on which the device chip is mounted, and around which the two perpendicularly disposed, in-plane rotating magnetic field producing coils are provided. It is necessary to arrange that the top surface of the device chip corresponds to the center-line of the two rotating field coils so that the inside dimension of the inner coil is determined by the combined substrate chip thicknesses. Typically these combined thicknesses are in the order of 35 thousands of an inch, resulting in an inside coil dimension of 70 thousands of an inch. In addition, in such devices it is normally found that the two rotating field coils need to overhang the device chip by an amount substantially equal to the inside dimension of the inner coil so that the combined thickness of the substrate and chip also determines, to a large extent, the overall dimensions of the rotating field coils (and also their power dissipation) which in turn determine the overall device dimensions. A typical device of this form may have an overall device package height of 0.36 ins.; a leg pitch i.e. the distance between the normally provided two rows of connecting legs of 0.9 ins. and a coil dissipation of say 250 mW.

In current equipment utilising magnetic bubble devices in which a multiple board system is used, it is very desirable to use a board pitch of 0.5 ins. and with device packages having an overall height measurement of 0.36 ins. this is not possible.

It is an object of the present invention to provide a magnetic domain device of reduced height which lends itself to use in 0.5 ins. board pitch systems, where board pitch means the spacing between boards in a stacked board arrangement.

According to the present invention there is provided a magnetic domain device comprising a substrate, a device chip and interconnecting conductor means for connecting the device chip to the substrate and for supporting the device chip on the substrate so that the active surface thereof is substantially co-planar with the top surface of the substrate.

In one arrangement according to the invention, the substrate may be provided with a recess or hole through it in which the device chip is disposed so that the active surface thereof is substantially co-planar with the top surface of the substrate and in another arrangement according to the invention, the device chip may be secured to the interconnecting conductor means and the interconnecting conductor means may be secured to the substrate so that the device chip is mounted in 'flip-chip' configuration with its active surface in close proximity with the top surface of the substrate so as to be substantially co-planar therewith. Flip chip arrangement simply means that the device chip is turned over so that its active surface is close to the surface of the substrate.

In carrying out the invention the substrate may take the form of a printed circuit board of generally 'W' shaped form, and having an electrical conductor pattern on the top surface thereof, the device chip being attached to the conductor pattern by the interconnecting conductor means conveniently in the form of a flexible connector frame.

In one especially envisaged device, the flexible connector frame will be afforded by a polyimide film flexible connector frame obtainable as KAPTON (Registered Trade Mark of Dupont).

These and other features of the invention will now be described, reference being made to the accompanying drawings, in which:

FIG. 1 is a somewhat diagrammatic plan view of part of a known form of magnetic domain device;

FIG. 2 is a cross-sectional view on the lines A—A of the device of FIG. 1;

FIG. 3 is a somewhat diagrammatic plan view of part of a magnetic domain device in accordance with one form of the present invention;

FIG. 4 is a cross-sectional view on the lines A—A of the device of FIG. 3.

FIG. 5 is a somewhat diagrammatic plan view of part of a magnetic domain device in accordance with another form of the present invention. and;

FIG. 6 is a cross-sectional view on the lines A—A of the device of FIG. 5.

In FIGS. 1 and 2 of the accompanying drawing, there is depicted a magnetic (bubble) domain device of known form which consists of a generally 'W' shaped substrate 1, typically in the form of a printed circuit board, which is provided with two slots 2 which enable an inner one 3 of two perpendicularly disposed, in-plane rotating magnetic field producing coils 3 and 4 to encompass a central limb 5 of the substrate 1, to which is secured the device chip 6. The outer one 4 of the two rotating field coils 3 and 4 is arranged perpendicularly to the inner coil 3 so as to encompass the central limb 5 in the mutually perpendicular direction. It is arranged that the top surface of the printed circuit substrate is provided in the usual way with a printed conductor pattern (not shown) which enables electrical connection to the active surface 7 of the device chip 6 to be made within the two coils 3 and 4 by means of individual connecting wires 8, and also enables external electrical connection (not shown) to be made around the periphery of the substrate 1.

In order to obtain satisfactory operation of the device depicted in FIGS. 1 and 2, it is necessary that the active surface 7 of the device chip 6 i.e. the major surface that is not in contact with the substrate 1, lies co-planar with the center line of the two rotating field coils 3 and 4, so that the inside dimension of inner coil 3 is determined by the combined thicknesses of the substrate 1, typically 15 thousands of an inch, and device chip 6, typically 20 thousands of an inch. Thus a typical inside dimension of 70 thousands of an inch is obtained which determines, to a large extent to the overall package height of the device. In addition, in such devices, it is normally found that the two rotating field coils 3 and 4 need to overhang the device chip 6 by an amount substantially equal to the inside dimension of the inner coil 3, typically 70 thousands of an inch so that the combined thickness of the substrate 1 and chip 6 also determines to a large extent the overall dimensions of the rotating field coils 3 and 4, and thus also their power dissipation, which in turn determine the overall device dimensions. A typical device of this form may have an overall package height of 0.36 ins.; a leg pitch, assuming a dual in-line (DIL) package is used, of 0.9 ins. and a coil dissipation of 250 mW.

As has been hereinbefore mentioned, in current equipment utilising magnetic bubble devices in which a multiple board system is used, it is very desirable to use a board pitch of 0.5 ins., and with device packages having an overall height measurement of 0.36 ins., this is not possible.

In FIGS. 3 and 4 of the accompanying drawings there is depicted a modification of the device depicted in FIGS. 1 and 2 which enables a reduced package height to be obtained. In the arrangement of FIGS. 3 and 4, the various parts that correspond to those already described with reference to FIGS. 1 and 2 have been accorded the same reference numerals. In the device depicted in FIGS. 3 and 4, instead of mounting the device chip 6 on the surface of the center limb 5 of the substrate 1, the center limb 5 is provided with a central hole 9 of slightly larger size than the device chip 6, so allowing the device chip 6 to be accommodated within the thickness of the substrate 1. By so doing, the active surface 7 of device chip may be made co-planar with the top surface of the substrate 1, thus enabling an inner coil 3 to be used having an inside dimension of twice the substrate thickness e.g. 40 thousands of an inch to be used rather than 70 thousands of an inch thickness required in the arrangement of FIGS. 1 and 2. Additionally, due to the the inside dimension of the inner coil 3 being reduced, the required overhang of the device chip 6 is reduced enabling a device chip 6 of increased size as indicated to be used or alternatively, the same device chip size to be used with small coil configurations, which has the advantage of further reducing the overall device package dimensions and also the power dissipation of the coils 3 and 4. Typically, with an arrangement as depicted in FIGS. 3 and 4, with a device chip of the same size as used in the device of FIGS. 1 and 2 an overall height dimension typically of 0.30 ins. may be achieved with a leg pitch of 0.5 ins. to 0.6 ins. with a coil power dissipation of less than 100 mW. A device of this form does lend itself for use in a board mounting system having a board pitch of 0.5 ins. i.e., the space between adjacent boards in a stacked arrangement is 0.5 inches.

In order to support the device chip 6 in the hole 9 into the center limb 5 of the substrate 1, it is envisaged that a flexible connector frame 10 be used which in addition enables electrical connection between the device chip 6 and substrate 1 to be obtained. It is envisaged that one particularly suitable form of flexible connector frame may be fabricated from polyimide film obtainable as KAPTON (Registered Trade Mark of Dupont) or some similar material in which a plurality of conductors are embedded within an insulating flexible substrate. By using such a frame, it is envisaged that the electrical connections between the device chip 6 and the substrate 1 be carried out in one or more simultaneous operations, thus achieving a marked time and cost saving.

In FIGS. 5 and 6 of the accompanying drawings there is depicted a further modification of the device depicted in FIGS. 1 and 2 which enables a reduced height package to be obtained but in which, instead of mounting the device chip 6 in a hole 9 in the substrate 1 as in the device depicted in FIGS. 3 and 4, the device chip 6 is mounted in 'flip-chip' configuration, i.e., the device chip is turned over, again by means of a flexible connector frame 10 as in the device depicted in FIGS. 3 and 4. In this way the active surface 7 of the device chip may be arranged to be in close proximity with the top surface of the substrate 1 on which is carried the printed conductor pattern (not shown) to which the flexible connector frame 10 would be electrically connected. In a device of this form it is envisaged that the flexible connector frame be initially connected to the device chip, preferably in one simultaneous bonding operation and then the flexible connector frame be connected to the substrate connector pattern preferably using a further simultaneous bonding operation.

As in the device of FIGS. 3 and 4, the device of FIGS. 5 and 6 enables the inside dimensions of the coils 3 and 4 to be reduced with the consequent advantages as already described in connection with the devices of FIGS. 3 and 4.

It will be appreciated that the devices of FIGS. 3 and 4 and FIGS. 5 and 6 have been given by way of example only and various modifications may be incorporated without departing from the spirit of the invention. For example, instead of using a flexible connector frame in which a plurality of conductors are provided in an insulating flexible substrate, a connector frame consisting solely of supporting conductors may be used.

What is claimed is:

1. A magnetic domain device comprising a substrate, a magnetic domain device chip, the chip having an active surface, a pair of coils each having a central axis and each coil extending around the device chip for providing a rotating magnetic field in the plane of the chip, conductive interconnecting means connecting the device chip to the substrate and arranged to support the device chip so that the active surface is substantially coplanar with a surface of the substrate and with a plane containing the central axes of the coils.

2. A magnetic domain device as claimed in claim 7 in which the substrate is provided with a recess or hole throught it in which the device chip is disposed so that the active surface thereof is substantially co-planar with the top surface of the substrate.

3. A magnetic domain device as claimed in claim 7 in which the device chip is secured to the interconnecting conductor means and the interconnecting conductor means is secured to the substrate so that the device chip is mounted in "flip chip" configuration with its active surface in close proximity with the top surface of the substrate so as to be substantially co-planar therewith.

4. A magnetic domain device as claimed in claim 2, or claim 3, or claim 1, in which the substrate takes the form of a printed circuit board of a generally "W" shaped form and has an electrical conductor pattern on the top surface thereof, the device chip being attached to the conductor pattern by the interconnecting conductor means.

5. A magnetic domain device as claimed in claim 4 in which the interconnecting conductor means is provided in the form of a flexible connector frame.

6. A magnetic domain device as claimed in claim 5 in which the flexible connector frame is formed from polyimide film.

* * * * *